US011774505B1

(12) United States Patent
Wang et al.

(10) Patent No.: US 11,774,505 B1
(45) Date of Patent: Oct. 3, 2023

(54) ESTIMATION METHOD FOR SAFETY STATE OF BATTERY PACK BASED ON DEEP LEARNING AND CONSISTENCY DETECTION

(71) Applicants: CHINA AUTOMOTIVE TECHNOLOGY AND RESEARCH CENTER CO., LTD, Tianjin (CN); CATARC NEW ENERGY VEHICLE TEST CENTER (TIANJIN) CO., LTD., Tianjin (CN); CHINA AUTOMOTIVE INFORMATION TECHNOLOGY (TIANJIN) CO., LTD, Tianjin (CN)

(72) Inventors: Fang Wang, Tianjin (CN); Liang Yang, Tianjin (CN); Shiqiang Liu, Tianjin (CN); Wenbin Wang, Tianjin (CN); Hong Chang, Tianjin (CN); Xiaole Ma, Tianjin (CN); Weina Wang, Tianjin (CN); Yue Xu, Tianjin (CN)

(73) Assignees: CHINA AUTOMOTIVE TECHNOLOGY AND RESEARCH CENTER CO., LTD, Tianjin (CN); CATARC NEW ENERGY VEHICLE TEST CENTER (TIANJIN) CO., LTD., Tianjin (CN); CHINA AUTOMOTIVE INFORMATION TECHNOLOGY (TIANJIN), Tianjin (CN)

( * ) Notice: Subject to any disclaimer, the term of this patent is extended or adjusted under 35 U.S.C. 154(b) by 0 days.

(21) Appl. No.: 18/067,715

(22) Filed: Dec. 18, 2022

(30) Foreign Application Priority Data

Aug. 5, 2022 (CN) .......................... 202210934890.8

(51) Int. Cl.
*G01R 31/367* (2019.01)
*G06N 3/08* (2023.01)
(Continued)

(52) U.S. Cl.
CPC ......... *G01R 31/367* (2019.01); *G01R 31/389* (2019.01); *G01R 31/3842* (2019.01); *G06N 3/08* (2013.01)

(58) Field of Classification Search
CPC ........................... G01R 31/367; G01R 31/389
See application file for complete search history.

(56) References Cited

U.S. PATENT DOCUMENTS

| 2010/0324848 | A1* | 12/2010 | Cho | ...................... | B60L 3/0046 |
| | | | | | 702/63 |
| 2014/0358459 | A1* | 12/2014 | Trnka | ................... | G01R 31/367 |
| | | | | | 324/426 |

(Continued)

FOREIGN PATENT DOCUMENTS

| CA | 2312902 A1 | 6/1999 |
| CN | 104062541 A | 9/2014 |

(Continued)

*Primary Examiner* — Ricky Go
(74) *Attorney, Agent, or Firm* — True Shepherd LLC; Andrew C. Cheng

(57) ABSTRACT

Disclosed is an estimation method for the safety state of a battery pack based on deep learning and consistency detection, including: acquiring battery parameters of each single battery in the battery pack in a charging process to be identified; calculating multiple groups of feature data according to the battery parameters; constituting a first matrix by the multiple groups of feature data, and calculating a covariance matrix of the first matrix; inputting the covariance matrix into a first trained fully connected layer, so as to extract principal components of the first matrix and obtain a second matrix; multiplying the first matrix and the second matrix to obtain a third matrix; and inputting the (Continued)

third matrix into a series-connected and trained multi-head self-attention layer and classification layer, to identify whether single battery consistency safety hazards exist in the charging process. This embodiment improves the accuracy of identification.

9 Claims, 3 Drawing Sheets

(51) Int. Cl.
*G01R 31/3842* (2019.01)
*G01R 31/389* (2019.01)

(56) References Cited

U.S. PATENT DOCUMENTS

| | | | |
|---|---|---|---|
| 2017/0242078 A1* | 8/2017 | Kuper | ............... H01M 10/425 |
| 2018/0136285 A1* | 5/2018 | You | ................. G01R 31/392 |
| 2019/0025379 A1* | 1/2019 | Pajovic | ................ G01R 31/367 |
| 2019/0049518 A1* | 2/2019 | Shen | ..................... G01N 29/48 |
| 2019/0157891 A1* | 5/2019 | Chemali | ........... H02J 7/007192 |
| 2019/0170827 A1* | 6/2019 | Shoa Hassani Lashidani ............. H02J 7/0068 |
| 2020/0294282 A1 | 9/2020 | Schlemper et al. | |
| 2021/0247477 A1 | 8/2021 | Takeshima | |
| 2021/0327061 A1 | 10/2021 | Clymer et al. | |
| 2022/0036123 A1* | 2/2022 | Cummings | .......... G06V 10/776 |
| 2022/0179026 A1 | 6/2022 | Zaiss et al. | |

FOREIGN PATENT DOCUMENTS

| | | |
|---|---|---|
| CN | 107578007 A | 1/2018 |
| CN | 108122028 A | 6/2018 |
| CN | 108153982 A | 6/2018 |
| CN | 108830296 A | 11/2018 |
| CN | 111611924 A | 9/2020 |
| CN | 113537328 A | 10/2021 |
| CN | 114509679 A | 5/2022 |
| WO | 2021113879 A2 | 6/2021 |

* cited by examiner

ESTIMATION METHOD FOR SAFETY STATE OF BATTERY PACK BASED ON DEEP LEARNING AND CONSISTENCY DETECTION

CROSS-REFERENCE TO RELATED APPLICATIONS

This application claims priority to Chinese Patent Application No. 202210934890.8 with a filing date of Aug. 5, 2022. The content of the aforementioned application, including any intervening amendments thereto, is incorporated herein by reference.

TECHNICAL FIELD

Embodiments of the present invention relate to the field of artificial intelligence, in particular to an estimation method for the safety state of a battery pack based on deep learning and consistency detection.

DESCRIPTION OF RELATED ART

In recent years, with the rise of new energy vehicles, the demand for batteries is increasingly high. The popularization of new energy vehicles makes problems such as battery fires occur occasionally, which leads to serious safety problems. Therefore, it is of increasing importance to evaluate the safety state of batteries.

The existing battery safety early warning algorithms based on single batteries all determine whether batteries are safe or not based on charging current and voltage curves of the batteries at the current time. This method features complex actual working conditions, different aging degrees of batteries, etc., which lead to inconsistent trends of current and voltage curves. Moreover, due to the variety of battery models, the collection of charging time curves of all models of batteries is highly costly.

SUMMARY

Embodiments of the present invention provide an estimation method for the safety state of a battery pack based on deep learning and consistency detection, which identifies single battery consistency safety hazards through a neural network based on deep learning, thus improving the accuracy of identification.

In a first aspect, an embodiment of the present invention provides an estimation method for the safety state of a battery pack based on deep learning and consistency detection, including:

S110, acquiring battery parameters of each single battery in the battery pack in a charging process to be identified;

S120, calculating multiple groups of feature data according to the battery parameters, where each group of feature data is used for reflecting the consistency of each single battery within a period of time in the charging process;

S130, constituting a first matrix by the multiple groups of feature data, and calculating a covariance matrix of the first matrix; inputting the covariance matrix into a first trained fully connected layer, so as to extract principal components of the first matrix and obtain a second matrix; multiplying the first matrix and the second matrix to obtain a third matrix; and S140, inputting the third matrix into a series-connected and trained multi-head self-attention layer and classification layer, to identify whether single battery consistency safety hazards exist in the charging process, where the trained multi-head self-attention layer performs global correlation analysis on the third matrix, and the trained classification layer outputs, based on the analysis results, a classification result of whether single battery consistency safety hazards exist.

In a third aspect, an embodiment of the present invention further provides an electronic device. The electronic device includes: one or more processors; and a memory for storing one or more programs.

The one or more processors implement the estimation method for the safety state of a battery pack based on deep learning and consistency detection according to any embodiment when executing the one or more programs.

In a fourth aspect, an embodiment of the present invention further provides a computer-readable storage medium storing a computer program thereon. The program implements the estimation method for the safety state of a battery pack based on deep learning and consistency detection according to any embodiment is implemented when executed by a processor.

In the embodiments of the present invention, the consistency of single batteries is taken as an evaluation index for the safety state of batteries, and whether single battery consistency safety hazards exist is determined through the battery parameters of each single battery in the charging process. Specifically, an improved principal component analysis (PCA) algorithm is constructed by using a fully connected layer and its pre-processing and post-processing, to perform principal component analysis on feature data; then, global features of each principal component are further extracted by using a neural network model based on deep learning, and a classification result reflecting the consistency of each single battery is finally obtained. The neural network model based on deep learning is introduced inside and outside the traditional PCA algorithm in the whole process, which improves the accuracy of principal component analysis, reduces the interference of specific data values to principal component analysis results, also enhances the accuracy of consistency hazard identification, and fully exerts the advantages of fast calculation and high accuracy of the neural network model.

BRIEF DESCRIPTION OF THE DRAWINGS

In order to describe technical solutions in specific embodiments of the present invention or in the prior art more clearly, the accompanying drawings required in the description of the specific embodiments or the prior art will be briefly introduced below. Apparently, the accompanying drawings in the following description show only some embodiments of the present invention, and those of ordinary skill in the art can still derive other drawings from these drawings without any creative effort.

DESCRIPTION OF THE EMBODIMENTS

Figure 1:
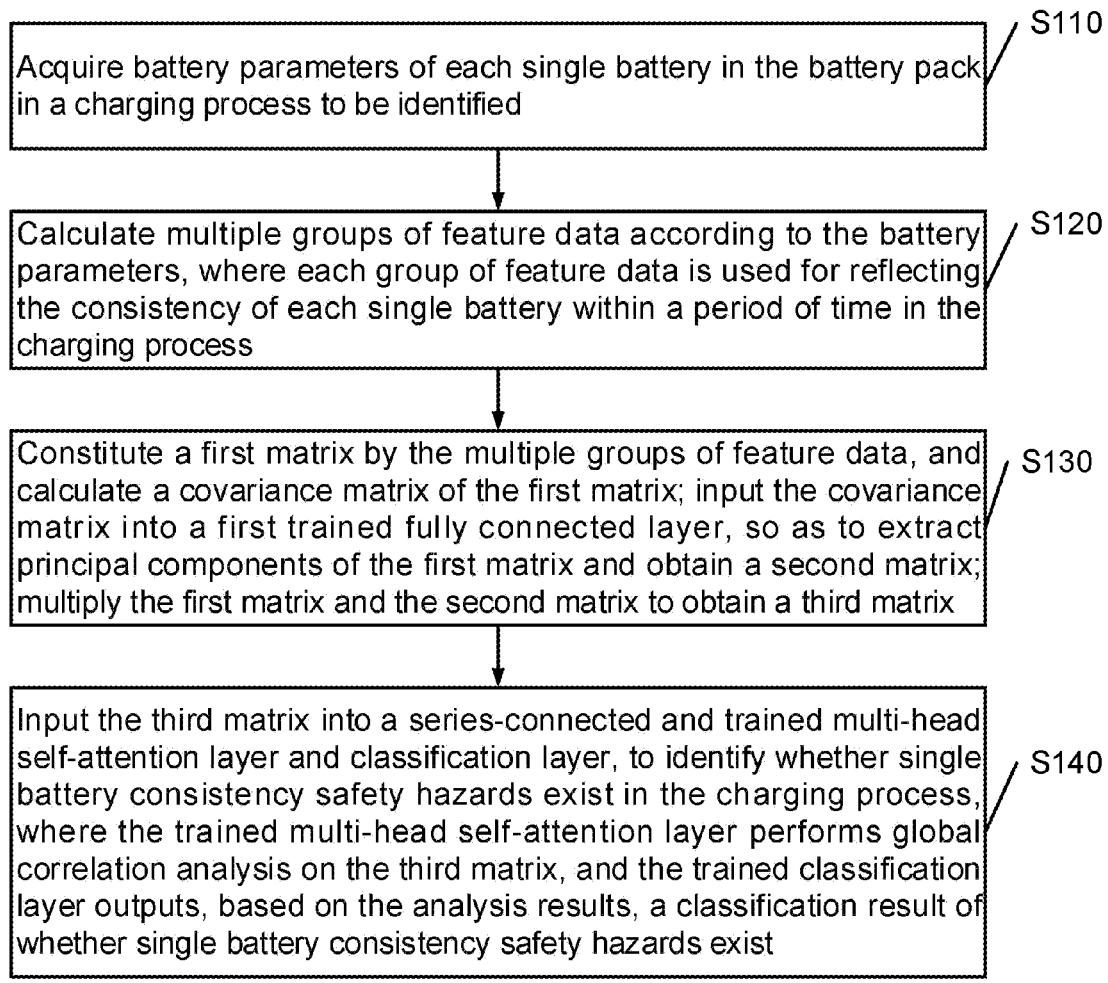
FIG. 1 is a flowchart of an estimation method for the safety state of a battery pack based on deep learning and consistency detection provided by an embodiment of the present invention.

In order to make the objectives, technical solutions and advantages of the present invention clearer, the technical solutions of the present invention will be described clearly and completely below. Obviously, the described embodiments are only some, but not all, embodiments of the present invention. Based on the embodiments of the present invention, all other embodiments obtained by those of ordinary skill in the art without any creative effort fall within the protection scope of the present invention.

In the description of the present invention, it should be noted that the terms "center", "upper", "lower", "left", "right", "vertical", "horizontal", "inner", "outer" and the like indicate the orientations or positional relationships based on those shown in the drawings. The terms are only for description convenience of the present invention and simplification of the description, but do not indicate or imply that the pointed devices or units must have specific orientations or be constructed and operated in specific orientations. Therefore, the terms should not be understood to limit the present invention. Furthermore, the terms "first", "second" and "third" are only for the sake of description, and cannot be understood as indicating or implying the relative importance.

In the description of the present invention, it should also be noted that, unless otherwise specified and defined, the terms "mounted", "coupled" and "connected" should be generally understood, for example, the "connected" may be fixedly connected, detachably connected, integrally connected, mechanically connected, electrically connected, directly connected, or connected by a medium, or communicating for the interiors of two elements. For those of ordinary skill in the art, the specific meanings of the terms described above in the present invention can be construed according to specific circumstances.

In view of various defects in determining battery safety based on current and voltage curves in the prior art, the present invention proposes an estimation method for the safety state of a whole battery pack based on the consistency detection principle of single batteries. Specifically, the battery pack is composed of a plurality of single batteries connected in series and parallel. In most cases, one of the single batteries makes a battery fail, while other single batteries are safe. The consistency of single batteries in the whole battery pack is detected. If the features of all the single batteries in the battery pack are consistent, it can be determined that the battery pack is safe; otherwise, the battery pack has potential safety hazards.

Based on the above principle, FIG. 1 is a flowchart of an estimation method for the safety state of a battery pack based on deep learning and consistency detection provided by an embodiment of the present invention. The method is suitable for determining, through parameters of single batteries in a charging process, whether the battery pack has consistency safety hazards, and is executed by an electronic device. As shown in FIG. 1, the method specifically includes:

S110, battery parameters of each single battery in the battery pack in a charging process to be identified are acquired.

This embodiment acquires battery parameters of a battery pack of a new energy vehicle in a charging process from big data of the Internet of vehicles. The battery parameters include at least one of the following parameters: real-time temperature, a voltage, a current and internal resistance of each single battery. Optionally, noise and invalid data are generated due to voltage fluctuation, sensor abnormality, etc., so after real-time battery parameters are acquired, the invalid data are filtered out through Kalman filtering.

S120, multiple groups of feature data are calculated according to the battery parameters, where each group of feature data is used for reflecting the consistency of each single battery within a period of time in the charging process.

In this step, feature data representing the safety of the battery pack are constructed based on the acquired battery parameters. Specifically, the feature data are used for reflecting the consistency of each single battery within a period of time. Optionally, first, the battery parameters of the same dimension are zero-meant. Zero-meaning refers to subtracting a mean value of a group of data from the group of data, which ensures that the data are evenly distributed, so as to avoid the problem of accuracy decrease caused by inconsistent distribution of different sample data. In this embodiment, because the acquired battery parameters include different dimensions of temperature, a voltage, a current, internal resistance, etc., zero-meaning all data as a whole will cause interference between data of different dimensions, making zero-meaning meaningless. Therefore, the battery parameters of the same dimension are zero-meant in this step, that is, all temperature data are zero-meant, all voltage data are zero-meant, all current data are zero-meant, and all internal resistance data are zero-meant.

Then, the multiple groups of feature data are calculated according to the zero-meant battery parameters. Optionally, a mean value of any kind of zero-meant battery parameters within any period of time is calculated; the following feature data corresponding to the period of time are calculated according to the mean value: at least one of a sum, a mean value, a standard deviation and a median of the mean values of all the single batteries; and/or a standard deviation and/or a sum of cosine distances of the mean values of different single batteries. In addition, an initial value and/or a sum of any kind of zero-meant battery parameters in the charging process to which any period of time belongs are taken as one or more kinds of feature data corresponding to the period of time. Preferably, 30 kinds of feature data as shown in Table 1 are finally constructed to reflect the consistency of the single batteries within each period of time in the charging process.

TABLE 1

| Kind of feature data |
| --- |
| 1 Mean value of mean temperatures of all single batteries in the battery pack in a charging process |
| 2 Standard deviation of mean temperatures of all single batteries in the battery pack in a charging process |
| 3 Sum of cosine distances of mean temperatures of different single batteries in the battery pack in a charging process |
| 4 Standard deviation of cosine distances of mean temperatures of different single batteries in the battery pack in a charging process |
| 5 Median of mean temperatures of all single batteries in the battery pack in a charging process |
| 6 Mean value of mean voltages of all single batteries in the battery pack in a charging process |
| 7 Standard deviation of mean voltages of all single batteries in the battery pack in a charging process |
| 8 Mean value of cosine distances of mean voltages of different single batteries in the battery pack in a charging process |
| 9 Standard deviation of cosine distances of mean voltages of different single batteries in the battery pack in a charging process |
| 10 Median of mean voltages of all single batteries in the battery pack in a charging process |
| 11 Mean value of mean currents of all single batteries in the battery pack in a charging process |
| 12 Standard deviation of mean currents of all single batteries in the battery pack in a charging process |
| 13 Mean value of cosine distances of mean currents of different single batteries in the battery pack in a charging process |
| 14 Standard deviation of cosine distances of mean currents of different single batteries in the battery pack in a charging process |

TABLE 1-continued

Kind of feature data

15 Median of mean currents of all single batteries in the battery pack in a charging process
16 Mean value of mean internal resistances of all single batteries in the battery pack in a charging process
17 Standard deviation of mean internal resistances of all single batteries in the battery pack in a charging process
18 Mean value of cosine distances of mean internal resistances of different single batteries in the battery pack in a charging process
19 Standard deviation of cosine distances of mean internal resistances of different single batteries in the battery pack in a charging process
20 Median of mean internal resistances of all single batteries in the battery pack in a charging process
21 Mean value of time taken by all single batteries in the battery pack in a complete charging process
22 Median of time taken by all single batteries in the battery pack in a complete charging process
23 Standard deviation of time taken by all single batteries in the battery pack in a complete charging process
24 Mean value of cosine distances of time taken by different single batteries in the battery pack in a complete charging process
25 Standard deviation of cosine distances of time taken by different single batteries in the battery pack in a complete charging process
26 Median of initial charging voltages of all single batteries in the battery pack
27 Median of initial charging currents of all single batteries in the battery pack
28 Median of initial charging resistances of all single batteries in the battery pack
29 Total initial charging voltage of all single batteries in the battery pack
30 Total initial charging current of all single batteries in the battery pack Taking some kinds in Table 1 as examples, the calculation process of feature data is explained below. For example, the calculation process of the $1^{st}$ kind of feature data "mean value of mean temperatures of all single batteries in the battery pack in a charging process" in a group of feature data includes: a mean temperature of each single battery in the battery pack within the period of time is calculated, and a mean value of the mean temperatures of all the single batteries is calculated; the calculation process of the $4^{th}$ kind of feature data "standard deviation of cosine distances of mean temperatures of different single batteries in the battery pack in a charging process" includes: a mean temperature of each single battery in the battery pack within the period of time is calculated, a cosine distance of the mean temperatures of every two single batteries is calculated, and a standard deviation of all the cosine distances is calculated; the calculation process of the $21^{st}$ kind of feature data "mean value of time taken by all single batteries in the battery pack in a complete charging process" includes: a charging time taken by each single battery in the battery pack in the charging process to be identified is calculated, and a mean value of the charging time of all the single batteries is calculated; the calculation process of the $29^{th}$ kind of feature data "total initial charging voltage of all single batteries in the battery pack" includes: an initial voltage of each single battery in the battery pack in the charging process to be identified is obtained, and a sum of the initial voltages of all the single batteries is calculated. The calculation processes of the remaining feature parameters are similar, so details are not described again.

S130, a first matrix is constituted by the multiple groups of feature data, and a covariance matrix of the first matrix is calculated; the covariance matrix is input into a first trained fully connected layer, so as to extract principal components of the first matrix and obtain a second matrix; and the first matrix and the second matrix are multiplied to obtain a third matrix.

Because different kinds of feature data are coupled and related and contain a lot of invalid information, PCA is performed on the multiple groups of constructed feature data in this step, which reduces calculation and retains principal information. The traditional PCA method includes the following steps:

1) A covariance matrix $$C = \frac{1}{m}XX^T$$

of an original data matrix X is solved, where m represents the number of kinds of feature data in the original data matrix X; in the specific embodiment corresponding to Table 1, m=30; and $X^T$ represents a transposition matrix of X;

2) Eigenvalues and corresponding eigenvectors of the covariance matrix C are solved;
3) The eigenvectors are arranged in rows from top to bottom according to the magnitudes of the corresponding eigenvalues to form a matrix, and the first k rows are taken to form a matrix P; and
4) A dimension-reduced data matrix is solved: Y=PX.

The traditional PCA method takes the first k rows of eigenvectors as principal components of original data, which retains the principal information in the original data matrix, but the principal information reflects numerical statistical features of the original data matrix, which is not necessarily applicable to all data matrices. For other data matrices with the same kinds of data but different data values, some seemingly useless but important information dimensions may be abandoned. Therefore, the present application improves the traditional PCA algorithm, and combines the covariance matrix with a neural network model based on deep learning to extract principal information dimensions from various kinds of feature data.

Specifically, first, a first matrix is constituted by the multiple groups of feature data, and a covariance matrix of the first matrix is calculated. Taking the kinds of feature data shown in Table 1 as an example, it is assumed that N groups of feature data are constructed in S120, corresponding to N periods of time in the charging process, where N is a natural number, and the N periods of time may be independent of each other or overlap with each other, which is not limited in this embodiment. A first matrix X of 30×N is constituted by the N groups of feature data; and a covariance matrix $$C = \frac{1}{m}XX^T$$

of the first matrix is calculated, where C is a matrix of 30×30.

Then, the covariance matrix is input into a first trained fully connected layer for dimension reduction, so as to extract principal components of the first matrix and obtain a second matrix. Because the fully connected layer can carry out global operation on the matrix to capture global features, the purpose of principal component analysis by using the fully connected layer can be achieved, and dimension reduction of data can be achieved while principal components are retained. Specifically, a second matrix $\tilde{P}$ of k×30 can be obtained by setting parameters of the first fully connected layer, and this matrix is equivalent to the matrix P obtained by multiplying the first k rows of eigenvectors and corresponding eigenvalues in the traditional PCA method, and includes principal information dimensions in the first matrix. It is worth mentioning that the principal information dimensions obtained here may be k eigenvectors out of the 30 eigenvectors obtained through the traditional PCA method, or k new information dimensions obtained by fusing the 30 eigenvectors. In either case, they all represent principal dimension information in the first matrix. Moreover, because the first fully connected layer is trained through a large number of data samples (the specific training process will be described in detail in subsequent embodiments), the principal information dimensions extracted here are adapted to a large number of data samples, can reflect common features of most data matrices with the same kinds of data but different data values, are less affected by the current data values of the first matrix, and are less likely to miss important information dimensions.

After the second matrix is obtained, the first matrix and the second matrix are multiplied to obtain a third matrix $\hat{Y}=\hat{P}X$. This step can be analogized to $Y=PX$ in the traditional PCA method, and the principal information in the first matrix is retained in the third matrix.

As can be seen, pre-processing for calculating a covariance matrix and post-processing for multiplying with the first matrix are added before and after the first fully connected layer in the whole S130, respectively, such that the first fully connected layer and its pre-processing and post-processing jointly constitute an improved PCA algorithm, and correspondingly, the output of the first fully connected layer has the physical meaning of principal components of the feature data. Compared with the traditional PCA algorithm, the principal components extracted through the method of this embodiment are less affected by specific data values, thus avoiding missing principal information dimensions. Compared with directly inputting the first matrix into a fully connected layer for dimension reduction, the dimension reduction process of this embodiment directly takes the principal components of the first matrix as extraction targets, such that the interpretability of information dimensions is stronger and the convergence speed in the training process is faster.

S140, the third matrix is input into a series-connected and trained multi-head self-attention layer and classification layer, to identify whether single battery consistency safety hazards exist in the charging process, where the trained multi-head self-attention layer performs global correlation analysis on the third matrix, and the trained classification layer outputs, based on the analysis results, a classification result of whether single battery consistency safety hazards exist.

The multi-head self-attention layer is used for global correlation analysis on the third matrix and extracting global features of the third matrix. Compared with correlation analysis through a convolutional layer, in which the convolutional layer performs local operation and can only extract the correlation between adjacent information dimensions; the multi-head self-attention layer performs global operation, and can extract the correlation between any two information dimensions, which is beneficial to elimination of the interference of an arrangement order of different information dimensions to the extraction of global features. Because the positional correlation among the principal information dimensions is not clear in this embodiment, the multi-head self-attention layer is particularly suitable for extracting the global features of the third matrix.

The classification layer outputs, based on the analysis results (i.e., the global features of the third matrix), a classification result of whether single battery consistency safety hazards exist. Specifically, if the output is 1, it indicates that single battery consistency safety hazards exist; if the output is 0, it indicates that single battery consistency safety hazards do not exist. Optionally, the classification layer includes a second fully connected layer and a sigmoid function; the second fully connected layer is used for reducing the dimensions of the analysis results to obtain an output of 1×1; and the sigmoid function classifies the dimension-reduced analysis results to obtain a classification result of 1 or 0.

In this embodiment, the consistency of single batteries is taken as an evaluation index for the safety state of batteries, and whether single battery consistency safety hazards exist is determined through the battery parameters of each single battery in the charging process. Specifically, the improved PCA algorithm is constructed by using a fully connected layer and its pre-processing and post-processing, to perform principal component analysis on feature data; then, global features of each principal component are further extracted by using a neural network model based on deep learning, and a classification result reflecting the consistency of each single battery is finally obtained. The neural network model based on deep learning is introduced inside and outside the traditional PCA algorithm in the whole process, which improves the accuracy of principal component analysis, reduces the interference of specific data values to principal component analysis results, also enhances the accuracy of consistency hazard identification, and fully exerts the advantages of fast calculation and high accuracy of the neural network model.

Figure 2:
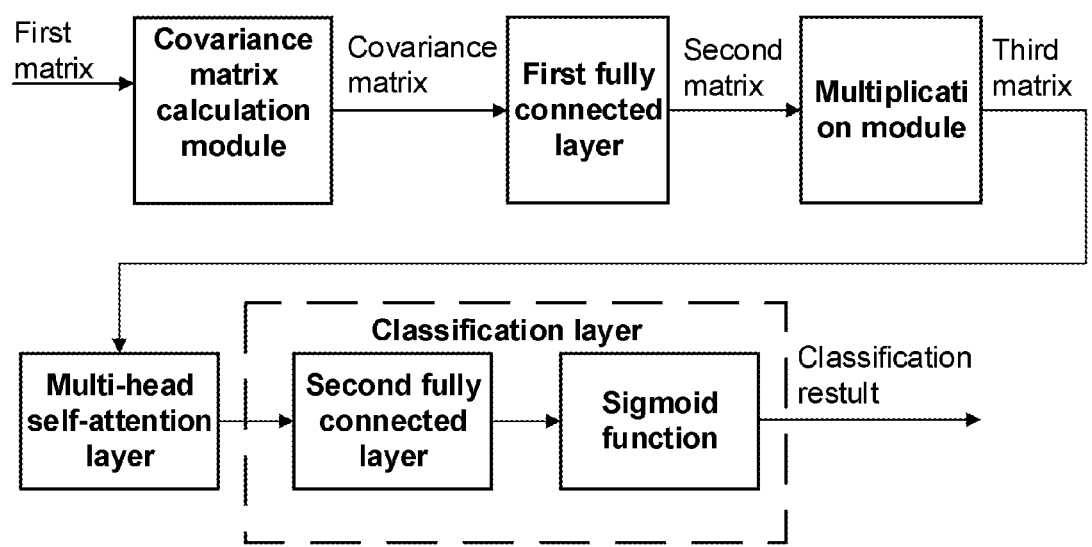
FIG. 2 is a schematic diagram of an identification model for single battery consistency safety hazards provided by an embodiment of the present invention.

On the basis of the above embodiments and the following embodiments, the data processing process composed of S130 and S140 is taken as an identification model for single battery consistency safety hazards in this embodiment, as shown in FIG. 2. A covariance matrix calculation module is used for calculating a covariance matrix of a first matrix, and a multiplication module is used for multiplying the first matrix and a second matrix. The training process of the identification model is detailed below. Optionally, before a first matrix is constituted by the multiple groups of feature data and a covariance matrix of the first matrix is calculated, the method further includes:

Step 1, battery parameters of each single battery in the battery pack in multiple charging processes are acquired. The battery pack here is any one or more battery packs, and the kinds of battery parameters are the same as those in S110.

Step 2, a plurality of samples are constructed according to the battery parameters, where each sample includes multiple groups of feature data in a charging process, and each group of feature data is used for reflecting the consistency of each single battery within a period of time in the corresponding charging process. The number of groups of feature data N and the kinds of feature data (such as 30 kinds of feature data in Table 1) in each sample in this step are the same as those of the multiple groups of feature data in S120.

Step 3, whether single battery consistency safety hazards exist in the charging process corresponding to each sample is marked. Specifically, the presence of consistency safety hazards is marked by 1, and the absence of consistency safety hazards is marked by 0.

Step 4, a first matrix constituted by each sample is input into the safety hazard identification model composed of S130 and S140 (i.e., the safety hazard identification model in FIG. 2), and a first fully connected layer, a multi-head self-attention layer and a classification layer in the model are trained, such that the output of the model continuously approaches the marking result of each training sample. The trained model can be used for safety hazard identification.

In this embodiment, the improved PCA method and the neural network model for determining consistency based on principal components are taken as an overall identification model for global training. Thus, whether consistency safety hazards exist in a certain charging process is required to be marked only, and the principal component dimensions of feature data are not required to be marked, which enhances the realizability of the method. In fact, it is very difficult to mark the principal component dimensions, but the consistency safety hazards can be conveniently marked through the existing physical detection methods, which greatly reduces the training difficulty.

Figure 3:
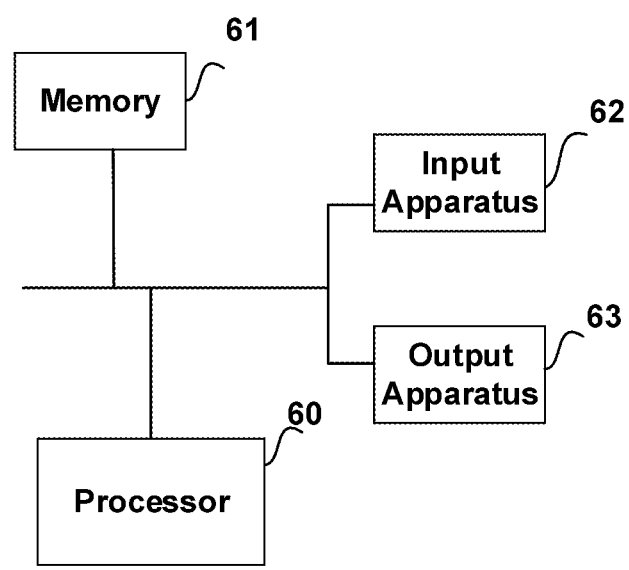
FIG. 3 is a schematic structural diagram of an electronic device provided by an embodiment of the present invention.

FIG. 3 is a schematic structural diagram of an electronic device provided by an embodiment of the present invention. As shown in FIG. 3, the electronic device includes a processor 60, a memory 61, an input apparatus 62 and an output apparatus 63. One or more processors 60 may be provided in the electronic device. One processor 60 is taken as an example in FIG. 3. The processor 60, the memory 61, the input apparatus 62 and the output apparatus 63 in the electronic device may be connected through a bus or in other ways, and they are connected through a bus as an example in FIG. 3.

As a computer-readable storage medium, the memory 61 can be used for storing software programs, computer executable programs and modules, such as program instructions/modules corresponding to the estimation method for the safety state of a battery pack based on deep learning and consistency detection in the embodiments of the present invention. The processor 60 executes various functional applications and data processing of the device by running the software programs, instructions and modules stored in the memory 61, that is, implements the above-mentioned estimation method for the safety state of a battery pack based on deep learning and consistency detection.

The memory 61 may mainly include a program storage area and a data storage area, where the program storage area may store an operating system, and an application program required for at least one function; and the data storage area may store data created according to use of a terminal, etc. In addition, the memory 61 may include a high speed random access memory, and may also include a non-volatile memory, such as at least one of a magnetic disk storage device, a flash memory, or other non-volatile solid-state storage device. In some examples, the memory 61 may further include memories arranged remotely from the processor 60, and the remote memories may be connected to the device through a network. Examples of the network include, but are not limited to, the Internet, an intranet, a local area network, a mobile communications network, or a combination thereof.

The input apparatus 62 may be used for receiving input numeric or character information, and generating a key signal input related to user settings and function control of the device. The output apparatus 63 may include a display device such as a display screen.

An embodiment of the present invention further provides a computer-readable storage medium storing a computer program thereon. The program implements the estimation method for the safety state of a battery pack based on deep learning and consistency detection according to any embodiment when executed by a processor.

The computer storage medium in the embodiment of the present invention may be one of or any combination of a plurality of computer-readable media. The computer-readable medium may be a computer-readable signal medium or a computer-readable storage medium. For example, the computer-readable storage medium may be, but not limited to, an electrical, magnetic, optical, electromagnetic, infrared, or semiconductor system, apparatus or device, or any combination of the above. More specific examples (a non-exhaustive list) of the computer-readable storage medium include: an electrical connection having one or more wires, a portable computer disk, a hard disk, a random access memory (RAM), a read-only memory (ROM), an erasable programmable read-only memory (EPROM or flash memory), an optical fiber, a portable compact disk read-only memory (CD-ROM), an optical memory, a magnetic memory, or any suitable combination of the above. Herein, the computer-readable storage medium may be any tangible medium containing or storing programs that may be used by an instruction execution system, apparatus or device or used in combination with same.

The computer-readable signal medium may include data signals in a baseband or propagated as part of carriers, where computer-readable program codes are carried. The propagated data signals may be in multiple forms, which include, but are not limited to, electromagnetic signals, optical signals or any suitable combination thereof. The computer-readable signal medium may also be any other computer-readable medium other than the computer-readable storage medium. The computer-readable medium is capable of sending, propagating or transmitting a program used by an instruction execution system, apparatus or device or used in combination with same.

The program codes included in the computer-readable medium may be transmitted by any suitable medium, which include, but are not limited to, a wireless medium, a wire, an optical cable, radio frequency (RF), etc., or any appropriate combination thereof.

The computer program codes for executing operations in the present invention may be compiled in one or more programming languages or a combination thereof. The programming languages include object-oriented programming languages, such as Java, Smalltalk or C++, and further include conventional procedural programming languages, such as "C" language or similar programming languages. The program codes may be completely or partially executed on a user computer, executed as a separate software package, partially executed on a user computer and partially executed on a remote computer, or completely executed on a remote computer or server. In the case involving a remote computer, the remote computer may be connected to a user computer through any network including a local area network (LAN) or a wide area network (WAN), or may be connected to an external computer (for example, through the Internet by using an Internet service provider).

Finally, it should be noted that the above embodiments are only used for explaining, but not limiting, the technical solutions of the present invention; although the present invention is described in detail with reference to the foregoing embodiments, those of ordinary skill in the art should understood that the technical solutions described in the foregoing embodiments may be modified, or some or all of the technical features may be equivalently substituted; and such modifications or substitutions do not make the essence of the corresponding technical solutions depart from the technical solutions of the embodiments of the present invention.

We claim:

1. An estimation method for the safety state of a battery pack based on deep learning and consistency detection, comprising:
   S110, performing a charging process on the battery pack and acquiring battery parameters of each single battery of the battery pack in the charging process;
   S120, determining consistency of said each single battery of the battery pack within a period of time in the charging process by establishing multiple groups of feature data with the battery parameters;
   S130, constituting a first matrix by the multiple groups of feature data, and calculating a covariance matrix of the first matrix; inputting the covariance matrix into a first trained fully connected layer, so as to extract principal components of the first matrix and obtain a second matrix; multiplying the first matrix and the second matrix to obtain a third matrix; and
   S140, inputting the third matrix into a series-connected and trained multi-head self-attention layer and classification layer, to identify whether single battery consistency safety hazards exist in the charging process, wherein the trained multi-head self-attention layer performs global correlation analysis on the third matrix, and the trained classification layer outputs, based on the analysis results, a classification result of whether single battery consistency safety hazards exist.

2. The evaluation method according to claim 1, wherein the battery parameters comprise at least one of the following: temperature, voltage, current and internal resistance.

3. The evaluation method according to claim 1, wherein the calculating multiple groups of feature data according to the battery parameters comprises:
   zero-meaning the battery parameters of a same dimension; and
   calculating the multiple groups of feature data according to the zero-meant battery parameters.

4. The evaluation method according to claim 3, wherein the calculating the multiple groups of feature data according to the zero-meant battery parameters comprises:
   calculating a mean value of any kind of zero-meant battery parameters within any period of time; and
   calculating the following feature data corresponding to the period of time according to the mean value:
   at least one of a sum, a mean value, a standard deviation and a median of the mean values of all the single batteries; and/or
   a standard deviation and/or a sum of cosine distances of the mean values of different single batteries.

5. The evaluation method according to claim 3, wherein the calculating the multiple groups of feature data according to the zero-meant battery parameters comprises:
   taking an initial value and/or a sum of any kind of zero-meant battery parameters in the charging process to which any period of time belongs as feature data corresponding to the period of time.

6. The evaluation method according to claim 1, wherein the classification layer comprises a second fully connected layer and a sigmoid function;
   the second fully connected layer reduces the dimensions of the analysis results; and
   the sigmoid function classifies the dimension-reduced analysis results.

7. The evaluation method according to claim 1, wherein before the constituting a first matrix by the multiple groups of feature data, and calculating a covariance matrix of the first matrix, the method further comprises:
   acquiring battery parameters of each single battery in the battery pack in multiple charging processes;
   constructing a plurality of samples according to the battery parameters, wherein each sample comprises multiple groups of feature data in a charging process, and each group of feature data is used for reflecting the consistency of each single battery within a period of time in the corresponding charging process;
   marking whether single battery consistency safety hazards exist in the charging process corresponding to each sample; and
   inputting a first matrix constituted by each sample into a safety hazard identification model composed of a covariance matrix calculation module, a first fully connected layer, a multiplication module, a multi-head self-attention layer and a classification layer, and training the first fully connected layer, the multi-head self-attention layer and the classification layer in the model, such that the output of the model continuously approaches the marking result of each training sample, wherein the covariance matrix calculation module is used for calculating a covariance matrix of the first matrix, and the multiplication module is used for multiplying the first matrix and a second matrix.

8. An electronic device, comprising:
   one or more processors; and
   a memory for storing one or more programs, wherein the one or more processors implement the estimation method for the safety state of a battery pack based on deep learning and consistency detection according to claim 1 when executing the one or more programs.

9. A non-transitory computer-readable medium containing computer instructions stored therein for causing a computer processor to perform the estimation method for the safety state of a battery pack based on deep learning and consistency detection according to claim 1.

* * * * *